United States Patent
Zhang et al.

(10) Patent No.: US 12,385,995 B2
(45) Date of Patent: Aug. 12, 2025

(54) LOCAL COIL CONTROL APPARATUS AND WIRELESS LOCAL COIL IN MAGNETIC RESONANCE IMAGING SYSTEM

(71) Applicant: Siemens Healthcare GmbH, Erlangen (DE)

(72) Inventors: Qiu Yi Zhang, Shenzhen (CN); JianMin Wang, Shenzhen (CN); Markus Vester, Nuremberg (DE); Qian Yun Pang, Shenzhen (CN)

(73) Assignee: Siemens Healthineers AG, Forchheim (DE)

( * ) Notice: Subject to any disclaimer, the term of this patent is extended or adjusted under 35 U.S.C. 154(b) by 154 days.

(21) Appl. No.: 18/372,262

(22) Filed: Sep. 25, 2023

(65) Prior Publication Data
US 2024/0103106 A1 Mar. 28, 2024

(30) Foreign Application Priority Data
Sep. 26, 2022 (CN) .......................... 202211173187.6

(51) Int. Cl.
*G01R 33/36* (2006.01)
*G08C 17/02* (2006.01)

(52) U.S. Cl.
CPC ......... *G01R 33/3628* (2013.01); *G08C 17/02* (2013.01)

(58) Field of Classification Search
CPC ........................... G01R 33/3628; G08C 17/02
See application file for complete search history.

(56) References Cited

U.S. PATENT DOCUMENTS

| | | | | |
|---|---|---|---|---|
| 8,049,500 B2* | 11/2011 | Griswold | ........... | G01R 33/3692 324/318 |
| 10,473,738 B2* | 11/2019 | Duensing | ........... | G01R 33/3692 |
| 11,490,814 B2* | 11/2022 | Jasanoff | ............. | G01R 33/3628 |

* cited by examiner

*Primary Examiner* — Gregory H Curran
(74) *Attorney, Agent, or Firm* — Banner & Witcoff Ltd.

(57) ABSTRACT

A local coil control apparatus and a wireless local coil in a magnetic resonance imaging system. The apparatus includes a control signal transmission unit, the control signal transmission unit including a wireless receiving unit, a control signal extraction unit, and a control signal distribution unit. The wireless receiving unit receives, by a receiving antenna, a signal from a radiofrequency power amplifier emitted by a body coil of the MRI system, and transmits the signal to the control signal extraction unit; the control signal extraction unit, if it detects that the signal is background noise, generates a control signal instructing a local coil unit to switch to a tuned state, and, if it detects that the signal is broadband noise, generates a control signal instructing the local coil unit to switch to a detuned state, and distributes the control signal to each local coil unit through the control signal distribution unit.

13 Claims, 8 Drawing Sheets

LOCAL COIL CONTROL APPARATUS AND WIRELESS LOCAL COIL IN MAGNETIC RESONANCE IMAGING SYSTEM

TECHNICAL FIELD

The present disclosure relates to the field of MRI (magnetic resonance imaging) technology, particularly a local coil control apparatus in an MRI system, a wireless local coil in an MRI system, and an MRI system.

BACKGROUND

In an MRI system, control signals need to be transmitted to local coils to instruct the local coil to switch between tuned and detuned states. A control signal is sent before the start of MR scanning and activated during MR scanning.

FIG. 1 is a structural schematic diagram of an existing wireless MRI coil system. As shown in FIG. 1, the system comprises a wireless power/clock generation unit 11, a control signal transmission unit 12, and a wireless coil 13, wherein the wireless coil 13 comprises a receiving antenna 131, a power generation unit 132, a clock generation unit 133, and a control signal reception unit 134. The wireless power generation unit 11 is configured to receive an external wireless power signal and rectify it before transmitting it to the receiving antenna 131 of the wireless coil 13. This is then transmitted to the power generation unit 132 by the receiving antenna 131. The clock generation unit 11 is configured to transmit a clock signal of the main system to the receiving antenna 131 of the wireless coil 13, which is then transmitted to the clock generation unit 133 by the receiving antenna 131, thereby generating different reference clocks for different functional units in the wireless coil 13. The control signal transmission unit 12 is configured to transmit a control signal sent by the main system to the receiving antenna 131 of the wireless coil 13, which is then transmitted to the control signal reception unit 134 by the receiving antenna 131, and the control signal reception unit 134 parses and recovers the received control signal.

In a wireless MRI coil system, MR signal transmission is usually separated from other parts, and for example, before the control signal transmission unit 12 establishes communication between the main system and the wireless coil 13 by using a 2.4 GHz Wireless Fidelity (WiFi) module, a transmitting antenna, and a receiving antenna are additionally needed, as shown in FIG. 2. FIG. 2 is a structural schematic diagram of the control signal transmission part in an existing wireless MRI coil system, wherein, as shown in FIG. 2, the control signal tuning unit 121 and the transmitting antenna 122 constitute the control signal transmission unit 12 in FIG. 1, the control signal tuning unit 121 being configured to tune a control signal sent by the main system to a frequency different from the MR frequency, and then send it out by the transmitting antenna 122. The receiving antenna 1341 and the control signal demodulation unit 1342 constitute the control signal reception unit 134, shown in FIG. 1, wherein the receiving antenna 1341 is configured to receive a control signal and send it to the control signal demodulation unit 1342. The control signal demodulation unit 1342 demodulates and recovers the control signal.

An existing wireless MRI coil system has the following shortcomings:

Firstly, a transmitting antenna and a receiving antenna are also needed, and a separate data transmission module is also required, which is particularly inconvenient for a wireless coil as it takes up more space.

Secondly, using a 2.4 GHz WiFi module in the control signal transmission unit 12 can result in unwarranted interference with the MRI system, making the electromagnetic compatibility (EMC) design unnecessarily complex.

SUMMARY

In view of the above, in one aspect, an aspect of the present disclosure proposes a local coil control apparatus in an MRI system to reduce the control complexity of switching between tuned and detuned states of the local coil units in the MRI system, and completely avoid the interference by control signals for switching between tuned and detuned states with the reception of MR signals; in another aspect, a wireless local coil in an MRI system is proposed to reduce the control complexity of switching between tuned and detuned states of the local coil units in the MRI system, and completely avoid the interference by control signals for switching between tuned and detuned states with the reception of MR signals; in yet another aspect, an MRI system is proposed to reduce the control complexity of switching between tuned and detuned states of the local coil units in the MRI system, and completely avoid the interference by control signals for switching between tuned and detuned states with the reception of MR signals.

A local coil control apparatus in a magnetic resonance imaging (MRI) system, the apparatus comprising at least one control signal transmission unit, wherein
  the control signal transmission unit comprises a wireless receiving unit, a control signal extraction unit, and a control signal distribution unit, wherein
  the wireless receiving unit is configured to receive, by a receiving antenna, a signal from a radiofrequency power amplifier (RFPA) emitted by a body coil of the MRI system and transmit the signal to the control signal extraction unit;
  the control signal extraction unit is configured to detect whether a signal sent by the wireless receiving unit is background noise or broadband noise, and if the signal is background noise, it generates a control signal instructing the local coil unit to switch to a tuned state, and, if the signal is broadband noise, it generates a control signal instructing the local coil unit to switch to a detuned state, and sends the generated control signal to the control signal distribution unit;
  the control signal distribution unit is configured to distribute, to the local coil unit connected thereto, a control signal sent by the control signal extraction unit so that the local coil unit can switch between a tuned state and a detuned state according to the control signal.

The tuning frequency of the wireless receiving unit is a selected frequency farthest from the magnetic resonance (MR) frequency within the operating frequency range of the RFPA for use as the tuning frequency of the wireless receiving unit.

The wireless receiving unit is parallel to each local coil unit in the MRI system.

The control signal extraction unit is specifically configured to
  detect in real-time the voltage of a signal sent by the wireless receiving unit, and determine whether the current signal is background noise or broadband noise according to the voltage of the signal, and if the signal is background noise, it generates a first control signal instructing the local coil unit to switch to a tuned state, and outputs the first control signal to the control signal distribution unit, and, if the signal is broadband noise, it generates a second control signal instructing the local coil unit to switch to a detuned state, and outputs the second control signal to the control signal distribution unit;

and the control signal distribution unit is specifically configured to, on receiving a first control signal sent by the control signal extraction unit, generate a first level signal and distribute the first level signal to the local coil unit connected thereto, and, on receiving a second control signal sent by the control signal extraction unit, generate a second level signal and distribute the second level signal to the local coil unit connected thereto.

The control signal extraction unit is specifically configured to detect in real-time the voltage of a signal sent by the wireless receiving unit, and determine whether the current signal is background noise or broadband noise according to the voltage of the signal, and, if the signal is background noise, it generates a first level signal instructing the local coil unit to switch to a tuned state, and outputs the first level signal to the control signal distribution unit, and, if the signal is broadband noise, it generates a second level signal instructing the local coil unit to switch to a detuned state, and outputs the second level signal to the control signal distribution unit;

and the control signal distribution unit is specifically configured to, on receiving a first level signal sent by the control signal extraction unit, distribute the first level signal to the local coil unit connected thereto, and, on receiving a second level signal sent by the control signal extraction unit, distribute the second level signal to the local coil unit connected thereto.

The control signal extraction unit is an analog-to-digital converter (ADC) or an envelope detector.

The control signal extraction unit comprises a voltage limiter and an extraction module, wherein:

the voltage limiter is configured to limit the voltage of a signal sent by the wireless receiving unit to a preset voltage range and then send the signal to the extraction module;

the extraction module is configured to detect whether a signal sent by the voltage limiter is background noise or broadband noise, and, if the signal is background noise, it generates a control signal instructing the local coil unit to switch to a tuned state, and, if the signal is broadband noise, it generates a control signal instructing the local coil unit to switch to a detuned state, and sends the generated control signal to the control signal distribution unit.

The control signal extraction unit comprises an amplifier and an extraction module, wherein:

the amplifier is configured to amplify a signal sent by the wireless receiving unit and send it to the extraction module;

the extraction module is configured to detect whether a signal sent by the amplifier is background noise or broadband noise, and, if the signal is background noise, it generates a control signal instructing the local coil unit to switch to a tuned state, and, if the signal is broadband noise, it generates a control signal instructing the local coil unit to switch to a detuned state, and sends the generated control signal to the control signal distribution unit.

The extraction module is an ADC or an envelope detector.

The wireless receiving unit and the control signal extraction unit are interconnected by a cable or a printed circuit board (PCB) circuit, the control signal extraction unit and the control signal distribution unit are interconnected by a cable or a PCB circuit, and the control signal distribution unit and one or more local coil units corresponding thereto are interconnected by cables or PCB circuits.

A wireless local coil in a magnetic resonance imaging (MRI) system, the wireless local coil comprising a local coil control apparatus in an MRI system as described above, and each local coil unit connected to each control signal distribution unit in the local coil control apparatus, wherein:

the local coil unit is configured to switch between a tuned state and a detuned state according to a control signal sent by the control signal distribution unit connected thereto.

An MRI system comprising a local coil control apparatus in a magnetic resonance imaging (MRI) system as described above, or comprising a wireless local coil as described above.

In an aspect of the present disclosure, a wireless receiving unit is used to receive an output signal from an RFPA emitted by a body coil, and a control signal extraction unit is used to detect whether the output signal from the RFPA is background noise or broadband noise, and, if the signal is background noise, it generates a control signal instructing the local coil unit to switch to a tuned state, and, if the signal is broadband noise, it generates a control signal instructing the local coil unit to switch to a detuned state, before the control signal distribution unit distributes the control signal to the local coil unit connected thereto, so that there is no need to specifically generate control signals for controlling the local coil units to switch between tuned and detuned states, nor is there need to set up any specialized data transmission modules or transmitting antennas to transmit control signals for switching between the tuned and detuned states of the local coil units, which greatly reduces the control complexity of switching between tuned and detuned states of local coil units and, since the process of transmitting control signals for switching between tuned and detuned states of local coil units is asynchronous with the process of receiving MR signals, completely avoids interference with the reception of MR signals.

BRIEF DESCRIPTION OF THE DRAWINGS

Preferred aspects of the present disclosure are described below with reference to the drawings to give those skilled in the art a clearer understanding of the above-mentioned and other features and advantages of the present disclosure. In the figures.

Figure 1:
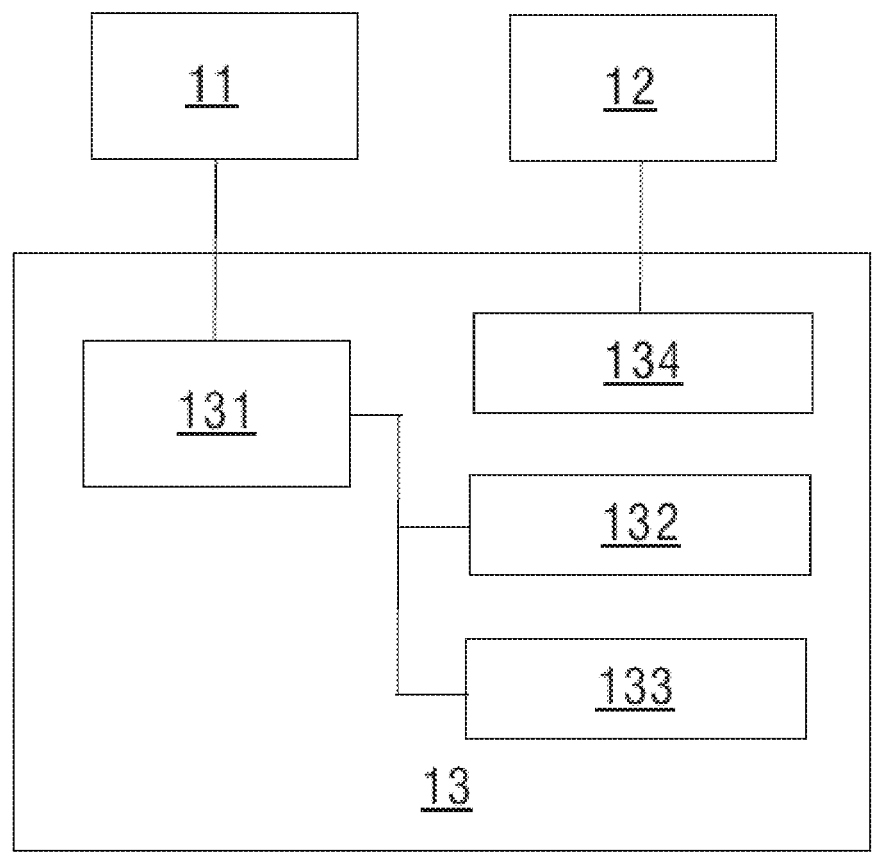
FIG. 1 is a structural schematic diagram of an existing wireless MRI coil system.
Figure 2:
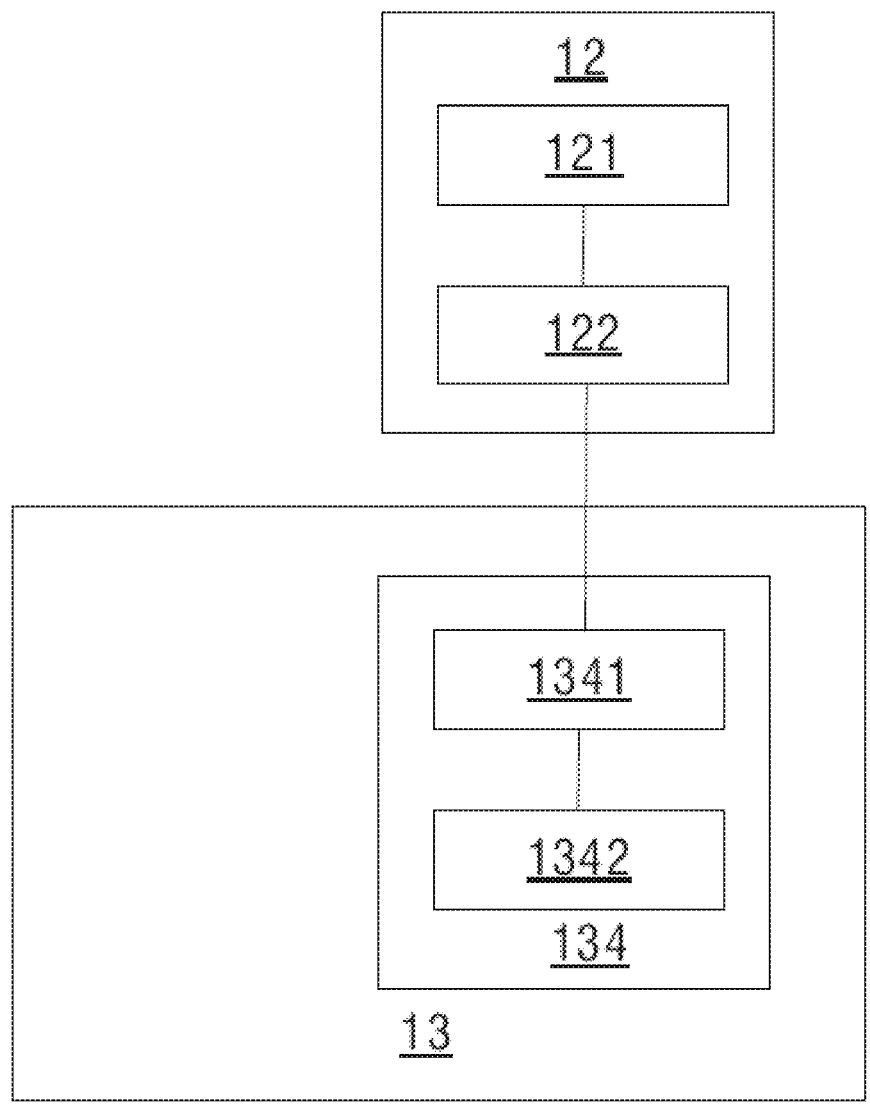
FIG. 2 is a structural schematic diagram of the control signal transmission part in an existing wireless MRI coil system.

The meanings of the reference numbers are as follows:

| Reference number | Meaning |
| --- | --- |
| 11 | Wireless power/clock generation unit |
| 12 | Control signal transmission unit |
| 13 | Wireless coil |
| 131 | Receiving antenna |
| 132 | Power generation unit |
| 133 | Clock generation unit |
| 134 | Control signal reception unit |
| 121 | Control signal tuning unit |
| 122 | Transmitting antenna |
| 1341 | Receiving antenna |
| 1342 | Control signal demodulation unit |
| 301 | RFPA |
| 302 | Body coil |
| 303 | Local coil unit |
| 30 | Local coil control apparatus in MRI system |
| 31 | Control signal transmission unit |
| 311 | Wireless receiving unit |
| 312 | Control signal extraction unit |
| 313 | Control signal distribution unit |
| 3121 | Voltage limiter |
| 3122 | Amplifier |
| 3123 | Extraction module |
| 81 | Sequence diagram of tuned/detuned states of body coil |
| 811 | Body coil in detuned state |
| 812 | Body coil in tuned state |
| 813 | Body coil in detuned state |
| 82 | Sequence diagram of RFPA activation/shutdown |
| 821 | RFPA in shutdown state |
| 822 | RFPA in activated state |
| 823 | RFPA in shutdown state |
| 83 | Sequence diagram of RF sequence transmission/stop |
| 831 | Stage without RF sequence transmission |
| 832 | RF sequence transmission stage |
| 833 | Stage of RF sequence transmission stop |
| 84 | Sequence diagram of the wireless receiving unit receiving background noise/broadband noise |
| 841 | Stage of the wireless receiving unit receiving background noise |
| 842 | Stage of the wireless receiving unit receiving broadband noise |
| 843 | Stage of the wireless receiving unit receiving background noise |
| 85 | Sequence diagram of tuned/detuned states of local coil unit |
| 851 | Local coil unit in tuned state |
| 852 | Local coil unit in detuned state |
| 853 | Local coil unit in tuned state |
| 90 | Wireless local coil in MRI system |

DETAILED DESCRIPTION

To make clearer the objectives, technical solutions, and benefits of the present disclosure, the present disclosure will be described in greater detail below with reference to aspects.

The inventor analyzed the operating process of an MRI system and found that when wireless coils are used as body coils and local coils, for local coils, only the state of each local coil unit, tuned or detuned, needs to be controlled.

The inventor also found that a) to avoid affecting the image quality of local coil units, a radiofrequency power amplifier (RFPA) for amplifying a radio frequency (RF) sequence remains activated during the MR transmission stage and shut down during the MR reception stage; b) when the RFPA is activated, due to its high gain, the RFPA will output broadband noise even without signal input; c) during the MR transmission stage, the local coil unit needs to remain detuned, and, during the MR reception stage, when the MR transmission system is shut down, the local coil unit needs to be tuned to receive the MR signal.

Based on the above findings, the inventor proposed the core idea of an aspect of the present disclosure: without the need to generate a control signal separately for a local coil unit, a signal output by the RFPA is received and whether a signal output by the RFPA is background noise or broadband noise is analyzed, and, if the signal is background noise, it is determined that the RFPA is in a shutdown state, so the local coil unit should be in a tuned state, and, if the signal is broadband noise, it is determined that the RFPA is in an activated state, so the local coil unit should be in a detuned state.

Figure 3:
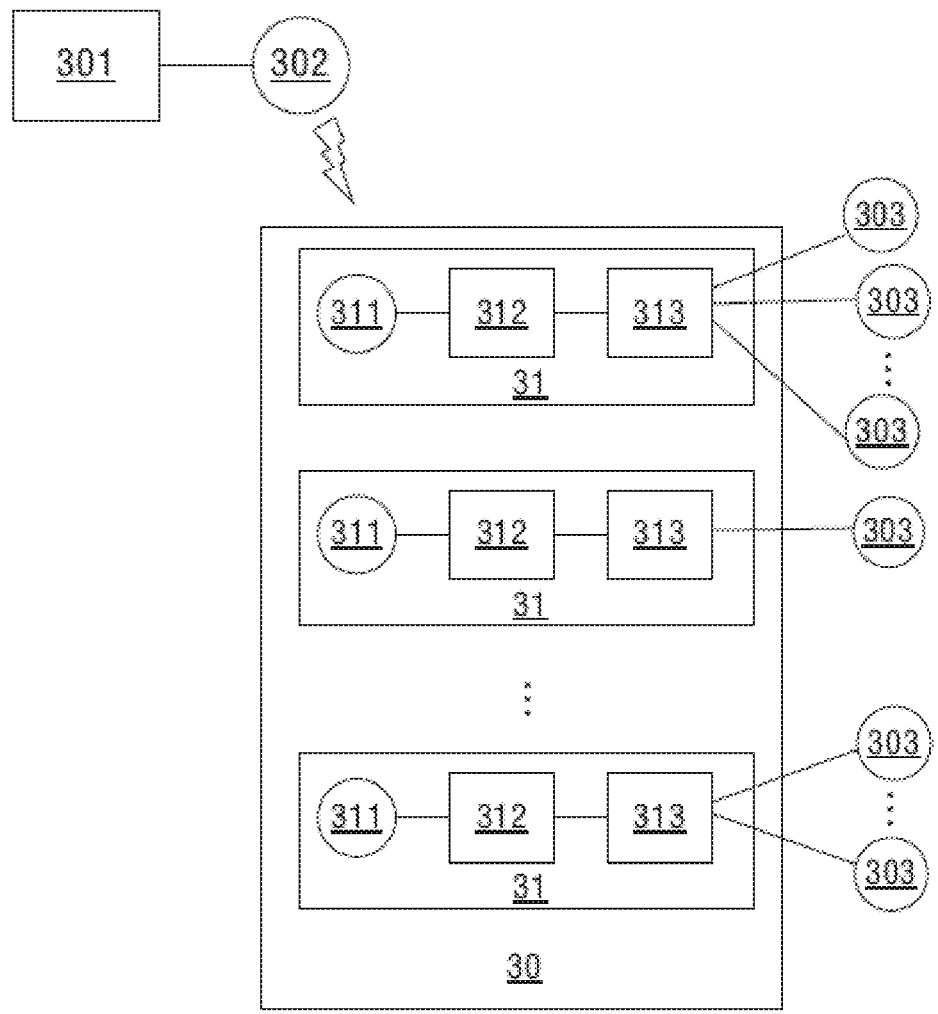
FIG. 3 is a structural schematic diagram of a local coil control apparatus in an MRI system provided by an aspect of the present disclosure.

FIG. 3 is a structural schematic diagram of a local coil control apparatus 30 in an MRI system provided by an aspect of the present disclosure, which comprises at least one control signal transmission unit 31, wherein:

the control signal transmission unit 31 comprises a wireless receiving unit 311, a control signal extraction unit 312, and a control signal distribution unit 313, wherein:

the wireless receiving unit 311 is configured to receive, by a receiving antenna, a signal from an RFPA 302 emitted by a body coil 301 of the MRI system, and transmit the signal to the control signal extraction unit 312;

the control signal extraction unit 312 is configured to detect whether a signal sent by the wireless receiving unit 311 is background noise or broadband noise, and, if the signal is background noise, it generates a control signal instructing the local coil unit 303 to switch to a tuned state, and, if the signal is broadband noise, it generates a control signal instructing the local coil unit 303 to switch to a detuned state, and sends the generated control signal to the control signal distribution unit 313;

the control signal distribution unit 313 is configured to distribute, to the local coil unit 303 connected thereto, a control signal sent by the control signal extraction unit 312 so that the local coil unit 303 can switch between a tuned state and a detuned state according to the control signal.

On receiving a control signal from the control signal distribution unit 313, the local coil unit 303 determines whether the control signal corresponds to a tuned state or detuned state thereof and checks whether its current state is consistent with the state corresponding to the control signal, and, if yes, the current state remains unchanged, and if not, the current state is adjusted to be consistent with the state corresponding to the control signal.

In the above aspect, the wireless receiving unit 311 is used to receive an output signal from the RFPA 301 emitted by the body coil 302, and the control signal extraction unit 312 is used to detect whether the output signal from the RFPA 301 is background noise or broadband noise, and, if the signal is background noise, it generates a control signal instructing the local coil unit 303 to switch to a tuned state, and, if the signal is broadband noise, it generates a control signal instructing the local coil unit 303 to switch to a detuned state, before the control signal distribution unit 313 distributes the control signal to the local coil unit 303 connected thereto, so that there is no need to specifically generate control signals for controlling the local coil units 303 to switch between tuned and detuned states, nor is there need to set up any specialized data transmission modules or transmitting antennas to transmit control signals for switching between the tuned and detuned states of the local coil units 303, which greatly reduces the control complexity of switching between the tuned and detuned states of local coil units 303 and, since the process of transmitting control signals for switching between the tuned and detuned states of local coil units 303 is asynchronous with the process of receiving MR signals, completely avoids interference with the reception of MR signals.

In practical applications, the wireless receiving unit 311 may be designed to be as small as possible so that it is decoupled from a local coil unit.

Figure 4:
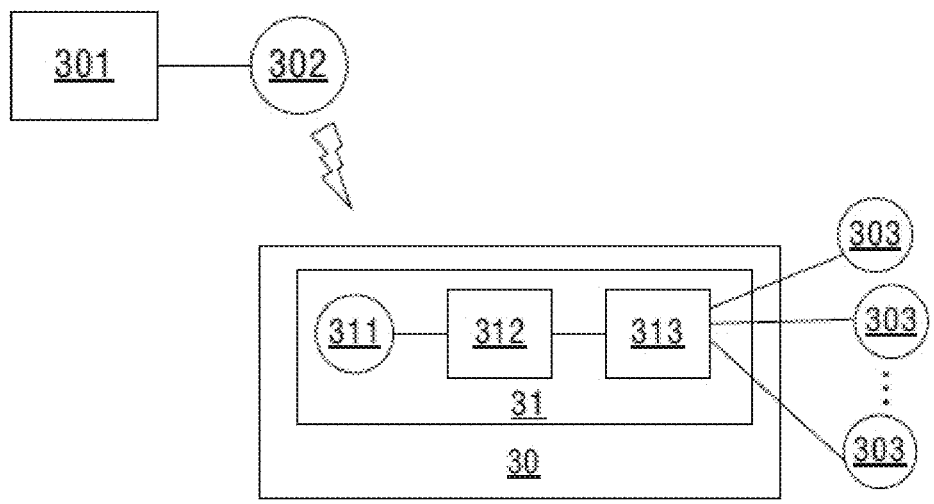
FIG. 4 is a structural schematic diagram of a local coil control apparatus in an MRI system provided by another aspect of the present disclosure.

In practical applications, to minimize the volume of the local coil control apparatus 30 in an MRI system, the local coil control apparatus 30 in an MRI system provided by an aspect of the present disclosure may comprise only one control signal transmission unit 31, and the control signal distribution unit 313 in the control signal transmission unit 31 is connected to all the local coil units 303, as shown in FIG. 4.

Figure 5:
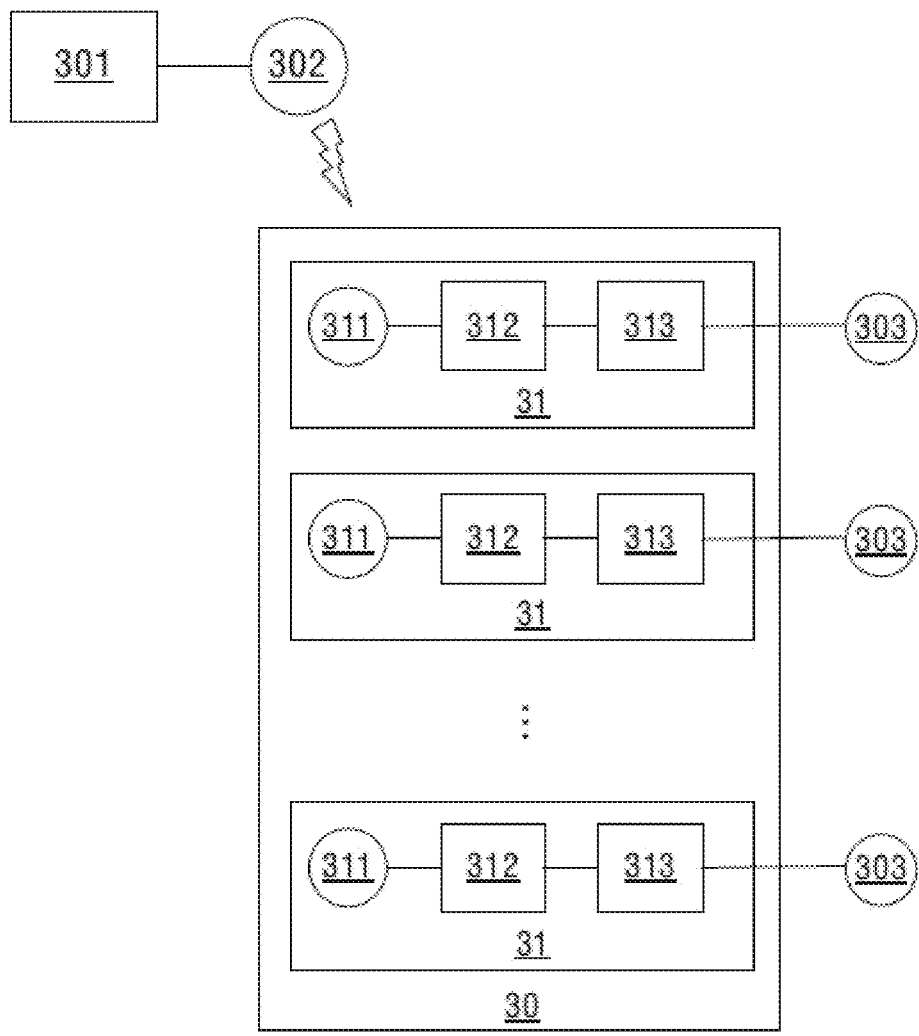
FIG. 5 is a structural schematic diagram of a local coil control apparatus in an MRI system provided by yet another aspect of the present disclosure.

Suppose a local coil has a large volume, to facilitate wiring. In that case, the local coil control apparatus 30 in an MRI system provided by an aspect of the present disclosure may comprise a plurality of control signal transmission units 31. The control signal distribution unit 313 in each control signal transmission unit 31 may be connected to one or more local coil units 303. Suppose a local coil has a sufficiently large volume. In that case, the control signal distribution unit 313 in each control signal transmission unit 31 may be connected to one local coil unit 303, as shown in FIG. 5.

In an optional aspect, to minimize interfering MR signals by the local coil control process, the tuning frequency of the wireless receiving unit 311 is a selected frequency that is farthest from the magnetic resonance (MR) frequency within the operating frequency range of the RFPA 301 for use as the tuning frequency of the wireless receiving unit 311.

In an optional aspect, the wireless receiving unit 311 is placed in parallel with each local coil unit 303 in the MRI system to ensure that the wireless receiving unit 311 maximally receives signals from the body coil.

It should be noted that since the body coil 302 is circularly polarized and has a large and uniform volume, the transmission characteristic between the body coil 302 and the wireless receiving unit 311 is stable, thus ensuring stable transmission of an output signal from the RFPA 301 to the wireless receiving unit 311.

In an optional aspect, the control signal extraction unit 312 is specifically configured to detect in real-time the voltage of a signal sent by the wireless receiving unit 311, and determine whether the current signal is background noise or broadband noise according to the voltage of the signal, and if the signal is background noise, it generates a first control signal instructing the local coil unit 303 to switch to a tuned state, and outputs the first control signal to the control signal distribution unit 313, and, if the signal is broadband noise, it generates a second control signal instructing the local coil unit 303 to switch to a detuned state, and outputs the second control signal to the control signal distribution unit 313;

and the control signal distribution unit 313 is specifically configured to, on receiving a first control signal sent by the control signal extraction unit 312, generate a first level signal and distribute the first level signal to the local coil unit 303 connected thereto, and, on receiving a second control signal sent by the control signal extraction unit 312, generate a second level signal and distribute the second level signal to the local coil unit 303 connected thereto.

After that, the local coil unit 303, on receiving a first level signal, switches to a tuned state; the local coil unit 303, on receiving a second level signal, switches to a detuned state.

It should be noted that when in the shutdown state, the RFPA 301 mainly outputs background noise; when in the activated state, the RFPA 301 outputs broadband noise, and when the RFPA 301 has been activated, an RF sequence may be received only after a short period of wait time, and when the RF sequence transmission has been completed, the RFPA 301 will shut down only after a short period of wait time, and, during the period when the RFPA 301 is activated and no RF sequence is received, the RFPA 301, due to its high gain, also outputs broadband noise, which means that the RFPA 301 keeps outputting broadband noise during the period when it is activated.

The control signal extraction unit 312 may prestore a voltage threshold to, on receiving a signal from the wireless receiving unit 311, determine in real-time whether the voltage of the signal is higher than the voltage threshold, and, if yes, it determines that the current signal is broadband noise, and if no, it determines that the current signal is background noise.

In the above aspect, the control signal extraction unit 312 detects in real-time the voltage of a signal sent by the wireless receiving unit 311 and determines whether the current signal is background noise or broadband noise according to the voltage of the signal, and if the signal is background noise, it generates a first control signal instructing the local coil unit 303 to switch to a tuned state, and outputs the first control signal to the control signal distribution unit 313, and, if the signal is broadband noise, it generates a second control signal instructing the local coil unit 303 to switch to a detuned state, and outputs the second control signal to the control signal distribution unit 313, which achieves the extraction of operating states of the RFPA 301 and ultimately controls the tuned/detuned states of local coil units.

In an optional aspect, the control signal extraction unit 312 is specifically configured to detect in real-time the voltage of a signal sent by the wireless receiving unit 311, and determine whether the current signal is background noise or broadband noise according to the voltage of the signal, and, if the signal is background noise, it generates a first level signal instructing the local coil unit 303 to switch to a tuned state, and outputs the first level signal to the control signal distribution unit 313, and, if the signal is broadband noise, it generates a second level signal instructing the local coil unit 303 to switch to a detuned state, and outputs the second level signal to the control signal distribution unit 313;

and the control signal distribution unit 313 is specifically configured to, on receiving a first level signal sent by the control signal extraction unit 312, distribute the first level signal to the local coil unit 303 connected thereto and, on receiving a second level signal sent by the control signal extraction unit 312, distributes the second level signal to the local coil unit 303 connected thereto.

In an optional aspect, the control signal extraction unit 312 is an analog-to-digital converter (ADC) or an envelope detector. Envelope detectors include power detectors and diode detectors.

When the control signal extraction unit 312 is an ADC, the ADC, on receiving a signal sent by the wireless receiving unit 311, converts the signal into a digital signal in real-time, detects the voltage of the digital signal in real-time, and determines whether the current signal is background noise or broadband noise according to the voltage of the digital signal, and, if the signal is background noise, it generates a first control signal instructing the local coil unit 303 to switch to a tuned state, and outputs the first control signal to the control signal distribution unit 313, and, if the signal is broadband noise, it generates a second control signal instructing the local coil unit 303 to switch to a detuned state, and outputs the second control signal to the control signal distribution unit 313;

alternatively, when the ADC, on receiving a signal from the wireless receiving unit 311, converts the signal into a digital signal in real-time, detects the voltage of the digital signal in real-time, and determines whether the current signal is background noise or broadband noise according to the voltage of the digital signal, and if the signal is background noise, it generates a first level signal instructing the local coil unit 303 to switch to a tuned state, and outputs the first level signal to the control signal distribution unit 313, and, if the signal is broadband noise, it generates a second level signal instructing the local coil unit 303 to switch to a detuned state, and outputs the second level signal to the control signal distribution unit 313.

When the control signal extraction unit 312 is an envelope detector, the envelope detector, on receiving a signal sent by the wireless receiving unit 311, detects the envelope of the signal in real-time, detects the voltage of the signal in real-time according to the envelope of the signal, and determines whether the current signal is background noise or broadband noise according to the voltage of the signal, and, if the signal is background noise, it generates a first control signal instructing the local coil unit 303 to switch to a tuned state, and outputs the first control signal to the control signal distribution unit 313, and, if the signal is broadband noise, it generates a second control signal instructing the local coil unit 303 to switch to a detuned state, and outputs the second control signal to the control signal distribution unit 313;

alternatively, the envelope detector, on receiving a signal from the wireless receiving unit 311, detects the envelope of the signal in real-time, detects the voltage of the signal in real-time according to the envelope of the signal, and determines whether the current signal is background noise or broadband noise according to the voltage of the signal, and if the signal is background noise, it generates a first level signal instructing the local coil unit 303 to switch to a tuned state, and outputs the first level signal to the control signal distribution unit 313, and, if the signal is broadband noise, it generates a second level signal instructing the local coil unit 303 to switch to a detuned state, and outputs the second level signal to the control signal distribution unit 313.

Figure 6:
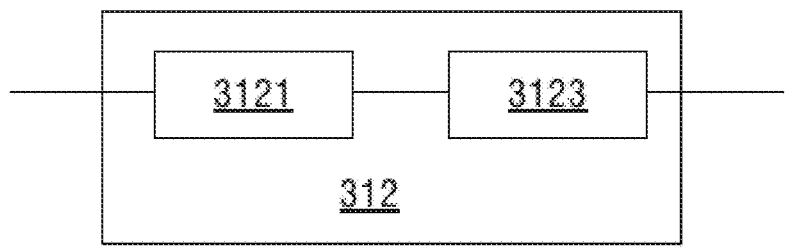
FIG. 6 is a structural schematic diagram of a control signal extraction unit provided by an aspect of the present disclosure.

Considering that the voltage range of signals output by the RFPA 301 may exceed the operating voltage range of the control signal extraction unit 312, an aspect of the present disclosure provides the following solution:

FIG. 6 is a structural schematic diagram of the control signal extraction unit 312 provided in an aspect of the present disclosure, and, as shown in FIG. 6, the control signal extraction unit 312 comprises a voltage limiter 3121 and an extraction module 3123, wherein:

the voltage limiter 3121 is configured to limit the voltage of a signal sent by the wireless receiving unit 311 to a preset voltage range and then send the signal to the extraction module 3123;

the extraction module 3123 is configured to detect whether a signal sent by the voltage limiter 3121 is background noise or broadband noise, and, if the signal is background noise, it generates a control signal instructing the local coil unit 303 to switch to a tuned state, and, if the signal is broadband noise, it generates a control signal instructing the local coil unit 303 to switch to a detuned state, and sends the generated control signal to the control signal distribution unit 313.

Figure 7:
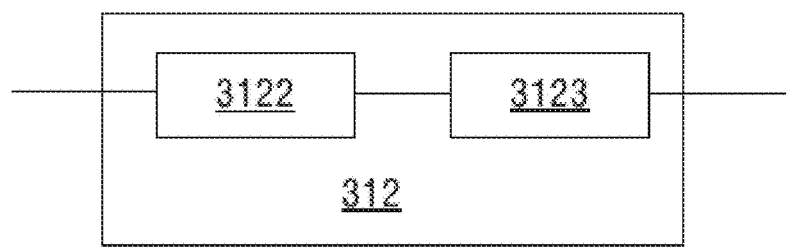
FIG. 7 is a structural schematic diagram of a control signal extraction unit provided by another aspect of the present disclosure.

Considering that the voltage range of signals output by the RFPA 301 may be too narrow compared with the operating voltage range of the control signal extraction unit 312, which is unfavorable for the signal processing accuracy of the control signal extraction unit 312, an aspect of the present disclosure provides the following solution:

FIG. 7 is a structural schematic diagram of the control signal extraction unit 312 provided by another aspect of the present disclosure, and, as shown in FIG. 7, the control signal extraction unit 312 comprises an amplifier 3122 and an extraction module 3123, wherein the amplifier 3122 is configured to amplify a signal sent by the wireless receiving unit 311 and then send it to the extraction module 3123;

the extraction module 3123 is configured to detect whether a signal sent by the amplifier 3122 is background noise or broadband noise, and, if the signal is background noise, it generates a control signal instructing the local coil unit 303 to switch to a tuned state, and, if the signal is broadband noise, it generates a control signal instructing the local coil unit 303 to switch to a detuned state, and sends the generated control signal to the control signal distribution unit 313.

In an optional aspect, the wireless receiving unit 311 and the control signal extraction unit 312 are interconnected by a cable or a printed circuit board (PCB) circuit, the control signal extraction unit 312 and the control signal distribution unit 313 are interconnected by a cable or a PCB circuit, and the control signal distribution unit 313 and one or more local coil units 303 corresponding thereto are interconnected by cables or PCB circuits.

Figure 8:
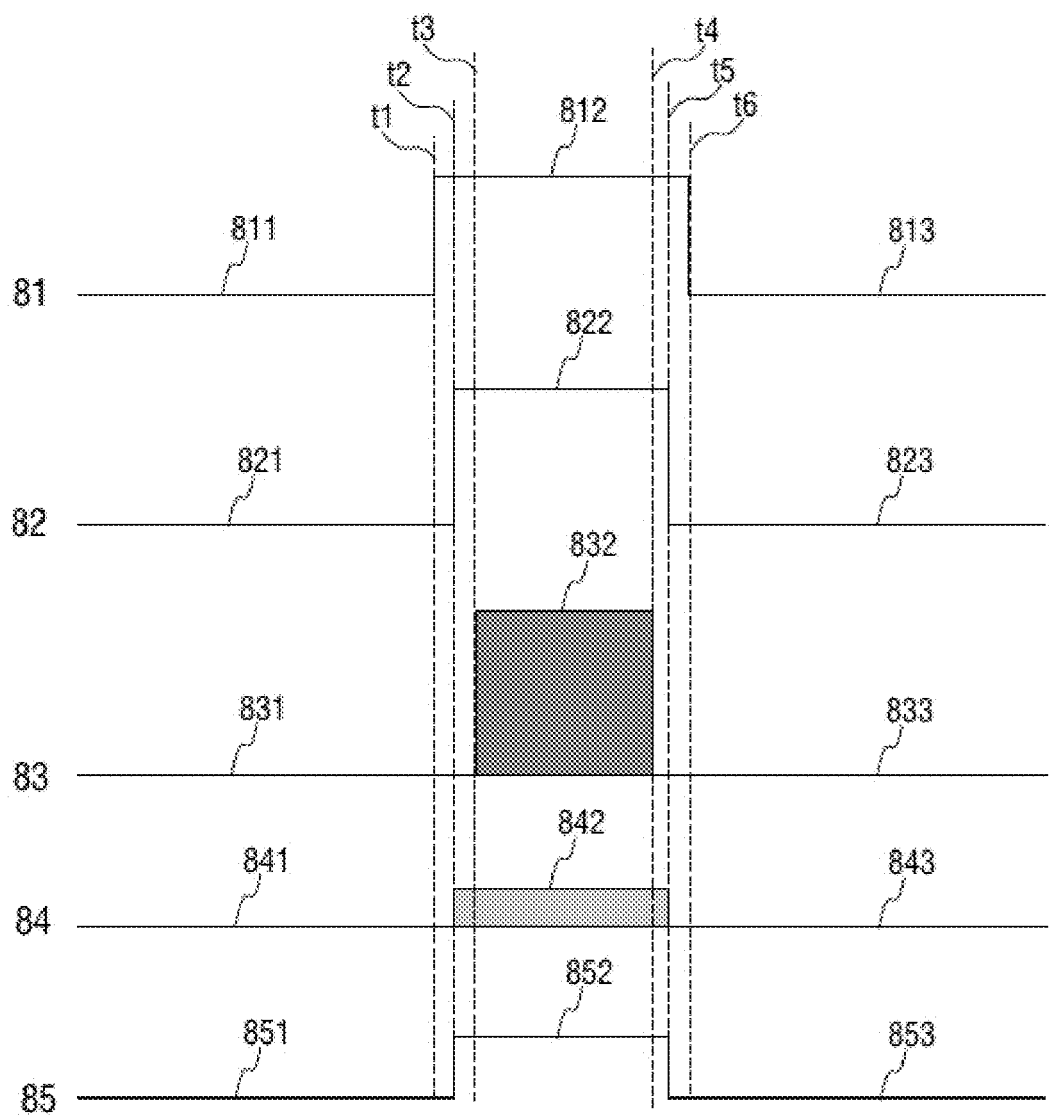
FIG. 8 shows sequence diagrams of a local coil control apparatus in an MRI system provided by an aspect of the present disclosure extracting a control signal for the local coil unit from an output signal of an RFPA.

FIG. 8 shows sequence diagrams of the local coil control apparatus 30 in an MRI system provided by an aspect of the present disclosure extracting a control signal for the local coil units from an output signal of the RFPA, wherein:

81 is a sequence diagram of the tuned/detuned state of the body coil 302;

82 is a sequence diagram of the activation/shutdown state of the RFPA 301;

83 is a sequence diagram of RF sequence transmission/stop;

84 is a sequence diagram of the wireless receiving unit 311 receiving background noise/broadband noise;

85 is a sequence diagram of the tuned/detuned state of the local coil unit 303;

It is clear from FIG. 8 that:

initially, all the functional units are in a shutdown state, and the RFPA 301 outputs background noise, wherein 811 indicates that the body coil 302 is in a detuned state, 821 indicates that the RFPA 301 is in a shutdown state, 831 indicates that there is no RF sequence transmission, 841 indicates that the wireless receiving unit 311 is in the stage of receiving background noise levels, and 851 indicates that the local coil unit 303 is in a tuned state;

at time t1, the body coil 302 is first activated and enters a tuned state from a detuned state, which means that 812 corresponds to a tuned state of the body coil 302;

subsequently, at time t2, the RFPA 301 is activated, meaning 822 indicates that the RFPA 301 is in an activated state;

at time t3, the radio-frequency sequence generator sends out an RF sequence, the RFPA 301 receives and amplifies the RF sequence before sending it out, and the body coil 302 receives the RF sequence and then sends it out, which means that 832 represents the RF sequence transmission stage;

since the RFPA 301 will output broadband noise after being activated, namely after time t2, the broadband noise will be extracted by the control signal extraction unit 312, and then a control signal is generated for a detuned state of the local coil unit 303, so that the local coil unit 303 enters a detuned state from time t2, which means that 842 represents the stage of the line receiving unit 311 receiving broadband noise and 852 indicates that the local coil unit 303 is in a detuned state;

at time t4, the radio-frequency sequence generator stops transmitting RF sequences, meaning 833 indicates an RF sequence transmission stop;

at time t5, the RFPA 301 shuts down, meaning 823 indicates that the RFPA 301 is in a shutdown state;

at time t6, the body coil 303 shuts down, meaning 813 indicates that the body coil 302 is in a detuned state;

when the RFPA 301 has shut down, namely after time t5, the RFPA 301 no longer outputs broadband noise and instead outputs background noise, which is extracted by the control signal extraction unit 312, and then a control signal is generated for a tuned state of the local coil unit 303, so that the local coil unit 303 enters a tuned state from time t5, meaning 843 represents the stage of the wireless receiving unit 311 receiving background noise and 853 indicates that the local coil unit 303 is in a tuned state.

It is thus clear that the control sequence of the local coil unit 303 is the same as the sequence of the wireless receiving unit 311 receiving background noise/broadband noise, and, compared with the tuned/detuned state control sequence of the body coil 302, the tuned/detuned state control sequence of the body coil 302 has an advance time (namely the period from time t1 to time t2) and a hold time (namely the period from time t5 to time t6), which will cause no errors in the tuned/detuned state switching of the local coil unit 303, as there are still an advance time (namely the period from t2 to t3) and a hold time (namely the period from t4 to t5) between the activation of the RFPA 301 and the excitation of the RF sequence signal. In addition, if necessary, the time of activation of the RFPA 301 may be the same as the time of activation of the body coil 302.

Figure 9:
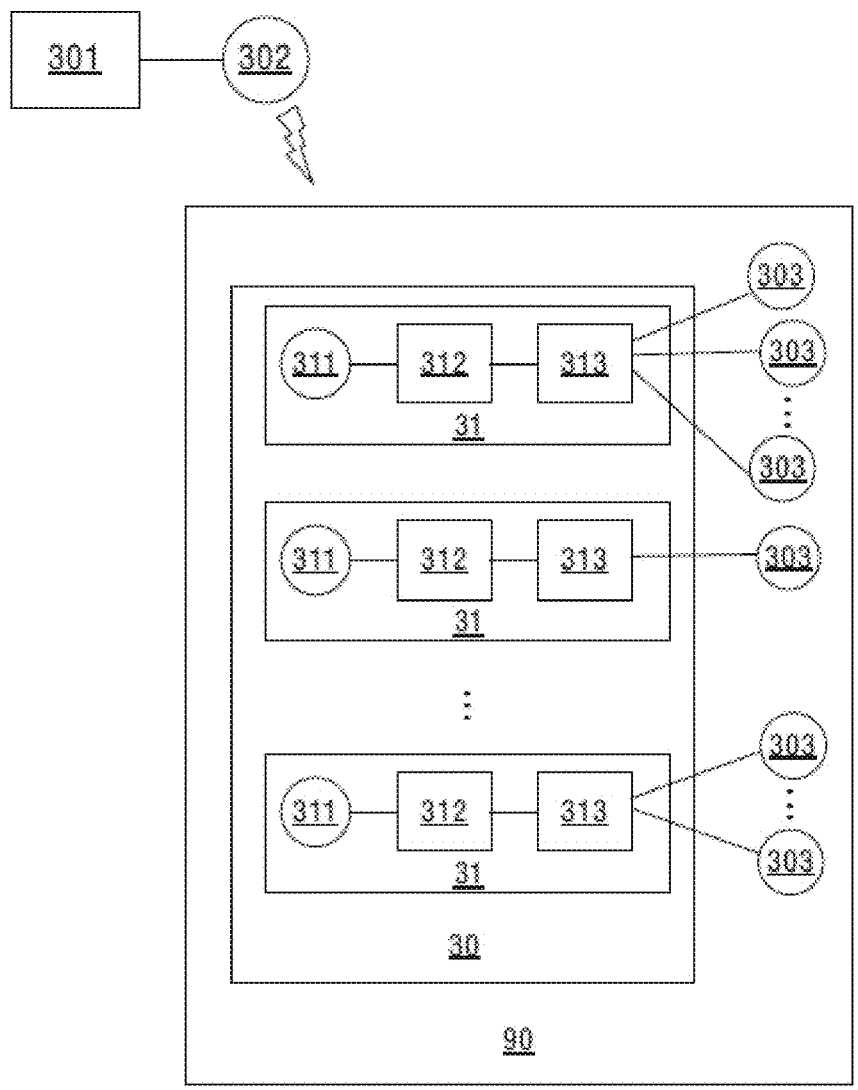
FIG. 9 is a structural schematic diagram of a wireless local coil in an MRI system provided by an aspect of the present disclosure.

FIG. 9 is a structural schematic diagram of the wireless local coil 90 in an MRI system provided by an aspect of the present disclosure, which comprises the local coil control apparatus 30 in an MRI system provided by any one of the above-described aspects of the present disclosure, and each local coil unit 303 connected to each control signal distribution unit 313 in the local coil control apparatus 30, wherein:

the local coil unit 303 is configured to switch between a tuned state and a detuned state according to a control signal sent by the control signal distribution unit 313 connected thereto.

An aspect of the present disclosure further provides an MRI system comprising a local coil control apparatus 30 in an MRI system provided by an aspect of the present disclosure or comprising a wireless local coil 90 in an MRI system provided by an aspect of the present disclosure.

The above-described aspects are only preferred aspects of the present disclosure rather than being intended to limit the scope of the present disclosure, and any modifications, equivalent substitutions, and improvements made without departing from the spirit or principle of the present disclosure shall fall within the scope of protection of the present disclosure.

The invention claimed is:

1. A local coil control apparatus in a magnetic resonance imaging (MRI) system for controlling a wireless local coil to switch between a tuned state and a detuned state, wherein the apparatus comprises:
   at least one control signal transmission unit comprising a wireless receiving unit, a control signal extraction unit, and a control signal distribution unit,
   wherein the wireless receiving unit is configured to receive, by a receiving antenna, a signal from a radiofrequency power amplifier (RFPA) emitted by a body coil of the MRI system, and transmit the signal to the control signal extraction unit,
   wherein the control signal extraction unit is configured to detect whether a signal sent by the wireless receiving unit is background noise or broadband noise, and if the signal is background noise, it generates a control signal instructing a local coil unit to switch to a tuned state, and, if the signal is broadband noise, it generates a control signal instructing the local coil unit to switch to a detuned state, and sends the generated control signal to the control signal distribution unit, and
   wherein the control signal distribution unit is configured to distribute, to the local coil unit connected thereto, a control signal sent by the control signal extraction unit, so that the local coil unit can switch between a tuned state and a detuned state according to the control signal.

2. The apparatus according to claim 1, wherein a tuning frequency of the wireless receiving unit is selected to be a frequency farthest from the magnetic resonance (MR) frequency within an operating frequency range of the RFPA as the tuning frequency of the wireless receiving unit.

3. The apparatus according to claim 1, wherein the wireless receiving unit is in parallel with each local coil unit in the MRI system.

4. The apparatus according to claim 1, wherein:
   the control signal extraction unit is configured to detect in real-time a voltage of a signal sent by the wireless receiving unit, and determine whether a current signal is background noise or broadband noise according to the voltage of the signal, and if the signal is background noise, generate a first control signal instructing the local coil unit to switch to a tuned state, and output the first control signal to the control signal distribution unit, and, if the signal is broadband noise, generate a second control signal instructing the local coil unit to switch to a detuned state, and output the second control signal to the control signal distribution unit, and the control signal distribution unit is configured to, on receiving a first control signal sent by the control signal extraction unit, generate a first level signal and distribute the first level signal to the local coil unit connected thereto, and, on receiving a second control signal sent by the control signal extraction unit, generate a second level signal and distributes the second level signal to the local coil unit connected thereto.

5. The apparatus according to claim 1, wherein:

the control signal extraction unit is configured to detect in real-time a voltage of a signal sent by the wireless receiving unit, and determine whether a current signal is background noise or broadband noise according to the voltage of the signal, and, if the signal is background noise, generate a first level signal instructing the local coil unit to switch to a tuned state, and output the first level signal to the control signal distribution unit, and, if the signal is broadband noise, generate a second level signal instructing the local coil unit to switch to a detuned state, and output the second level signal to the control signal distribution unit, and the control signal distribution unit is operable to, on receiving a first level signal sent by the control signal extraction unit, distribute the first level signal to the local coil unit connected thereto, and, on receiving a second level signal sent by the control signal extraction unit, distribute the second level signal to the local coil unit connected thereto.

6. The apparatus according to claim 1, wherein the control signal extraction unit is an analog-to-digital converter (ADC) or an envelope detector.

7. The apparatus according to claim 1, wherein the control signal extraction unit comprises a voltage limiter and an extraction module, wherein:

the voltage limiter is configured to limit the voltage of the signal sent by the wireless receiving unit to a preset voltage range and then send the signal to the extraction module, and the extraction module is configured to detect whether the signal sent by the voltage limiter is background noise or broadband noise, and, if the signal is background noise, generate a control signal instructing the local coil unit to switch to a tuned state, and, if the signal is broadband noise, generate a control signal instructing the local coil unit to switch to a detuned state, and sends the generated control signal to the control signal distribution unit.

8. The apparatus according to claim 1, wherein:

the control signal extraction unit comprises an amplifier and an extraction module, the amplifier is configured to amplify a signal sent by the wireless receiving unit and then send it to the extraction module, and the extraction module is configured to detect whether a signal sent by the amplifier is background noise or broadband noise, and, if the signal is background noise, it generates a control signal instructing the local coil unit to switch to a tuned state, and, if the signal is broadband noise, it generates a control signal instructing the local coil unit to switch to a detuned state, and sends the generated control signal to the control signal distribution unit.

9. The apparatus according to claim 7, wherein the extraction module is an ADC or an envelope detector.

10. The apparatus according to claim 1, wherein the wireless receiving unit and the control signal extraction unit are interconnected by a cable or a printed circuit board (PCB) circuit, the control signal extraction unit and the control signal distribution unit are interconnected by a cable or a PCB circuit, and the control signal distribution unit and one or more local coil units corresponding thereto are interconnected by cables or PCB circuits.

11. A wireless local coil in a magnetic resonance imaging (MRI) system, wherein the wireless local coil comprises a local coil control apparatus in an MRI system according to claim 1, and each local coil unit connected to each control signal distribution unit in the local coil control apparatus, wherein the local coil unit is configured to switch between a tuned state and a detuned state according to a control signal sent by the control signal distribution unit connected thereto.

12. An MRI system, comprising a local coil control apparatus in a magnetic resonance imaging (MRI) system according to claim 1.

13. An MRI system, comprising a wireless local coil according to claim 11.

* * * * *